United States Patent
Tsai et al.

(10) Patent No.: US 10,347,336 B1
(45) Date of Patent: Jul. 9, 2019

(54) METHOD FOR OBTAINING OPTIMAL OPERATING CONDITION OF RESISTIVE RANDOM ACCESS MEMORY

(71) Applicant: Winbond Electronics Corp., Taichung (TW)

(72) Inventors: Tsung-Huan Tsai, Taichung (TW); Lih-Wei Lin, Taichung (TW); I-Hsien Tseng, Taichung (TW); Wen-Ting Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/040,552

(22) Filed: Jul. 20, 2018

(51) Int. Cl.
*G11C 13/00* (2006.01)
*G11C 29/44* (2006.01)

(52) U.S. Cl.
CPC ...... *G11C 13/0069* (2013.01); *G11C 13/0011* (2013.01); *G11C 13/0097* (2013.01); *G11C 29/44* (2013.01); *G11C 2013/009* (2013.01)

(58) Field of Classification Search
CPC .. G11C 13/0011; G11C 13/0097; G11C 29/44
See application file for complete search history.

(56) References Cited

U.S. PATENT DOCUMENTS

| | | | | |
|---|---|---|---|---|
| 8,854,872 B2 * | 10/2014 | Lam | ............. | G11C 11/5628 365/148 |
| 9,424,916 B2 * | 8/2016 | Kwon | ............. | G11C 13/0064 |
| 2010/0110779 A1 * | 5/2010 | Liu | ............. | G11C 8/10 365/163 |
| 2011/0188292 A1 * | 8/2011 | Joo | ............. | G11C 13/0064 365/148 |
| 2014/0146593 A1 * | 5/2014 | Tsai | ............. | G11C 11/21 365/148 |
| 2016/0049197 A1 * | 2/2016 | Park | ............. | G11C 13/0069 365/148 |
| 2017/0141300 A1 * | 5/2017 | Trinh | ............. | H01L 45/08 |
| 2017/0345490 A1 * | 11/2017 | Yoshimoto | ............. | G11C 11/5642 |

* cited by examiner

*Primary Examiner* — Tri M Hoang
(74) *Attorney, Agent, or Firm* — JCIPRNET

(57) ABSTRACT

The disclosure provides a method for obtaining optimal operating condition of a resistive random access memory (RRAM). The method includes: retrieving an RRAM chip and performing a forming operation and an initial reset operation thereto based on a first operating condition; segmenting the RRAM chip into blocks; performing a set operation to each of the blocks based on various operating voltages; obtaining a fail bit value of each of the blocks; generating an operating characteristic curve related to the RRAM chip based on the fail bit value of each of the blocks and the operating voltages, wherein the operating characteristic curve has a lowest fail bit value and an operating voltage window; and when the lowest fail bit value and the operating voltage window satisfy a first condition and a second condition, respectively, determining the first operating condition is an optimal operating condition of the RRAM chip.

15 Claims, 6 Drawing Sheets

METHOD FOR OBTAINING OPTIMAL OPERATING CONDITION OF RESISTIVE RANDOM ACCESS MEMORY

BACKGROUND

Technical Field

The present disclosure relates to a method for obtaining an optimal operating condition of a memory, and particularly to a method for obtaining a forming operating condition and an initial reset operating condition of a resistive random access memory (RRAM).

Description of Related Art

RRAM is a non-volatile memory, each of the RRAM cells therein includes a top electrode plate, a bottom electrode plate and a resistive switching layer sandwiched between the top and bottom electrode plates. The dielectric material layer is typically insulated, and by applying suitable voltage on the top electrode plate to perform a forming operation to memory cell, a conductive path (typically referred to as conductive filament (CF)) that passes through the dielectric material layer may be formed in the dielectric material layer. When the conductive filament is formed, a reset operation (i.e., to make the conductive filament to break or rupture, thus causing high resistance state (HRS) to be generated on RRAM cell) can be performed thereto by applying suitable voltage on the top electrode plate.

Thereafter, the set operation (i.e., to form conductive filament again, thus causing low resistance state (LRS) to be generated on RRAM cell) can be performed to the RRAM cell again by applying suitable voltage on the top electrode plate. By performing the set operation and reset operation repeatedly, the resistance state (LRS or HRS) of RRAM can be controlled. LRS and HRS may be used to indicate digital signal, namely "0" or "1", thereby providing related memory function.

In existing technology, since the manufacturing process and material used for RRAM have been developed rapidly, it is an important issue for practitioners to obtain suitable operating condition quickly and effectively in the development of RRAM. If unsuitable operating condition is adopted, it is likely to cause misjudgment of material-related factor in the test process, which consequently affects the developing schedule and performance of RRAM. For RRAM that is manufactured with different processes and materials, since the forming operation and the initial reset operation are key steps that determine the aspect of conductive filament, if a specific suitable voltage range for the forming operation and the initial reset operation can be obtained, it is helpful to form a better conductive filament, thereby providing a good conducting path.

SUMMARY

In view of the above, the embodiments of the disclosure provides a method for obtaining an optimal operating condition of a resistive random access memory, which is capable of illustrating an operating characteristic curve corresponding to a RRAM chip that experiences a forming operation and an initial voltage operation according to a specific mechanism, thereby determining whether the forming operation and the initial voltage operation are the optimal operating conditions of the RRAM chip.

The disclosure provides a method for obtaining an optimal operating condition of a resistive random access memory, including the following steps: retrieving a first resistive random access memory chip, and performing a first forming operation and a first initial reset operation to the first resistive random access memory chip according to a first operating condition; segmenting the first resistive random access memory chip into a plurality of first blocks; performing a set operation to each of the first blocks respectively based on a plurality of operating voltages; obtaining a first fail bit value of each of the first blocks; generating a first operating characteristic curve associated with the first resistive random access memory chip according to the first fail bit value of each of the first blocks and the operating voltage, wherein the first operating characteristic curve has a first lowest fail bit value and a first operating voltage window; and when the first lowest fail bit value satisfies a first condition and the first operating voltage window satisfies a second condition, determining that the first operating condition is a first optimal operating condition of the first resistive random access memory chip.

Based on the above, the method provided in the embodiment of the disclosure is capable of performing different set operations to different blocks of RRAM chip based on various operating voltages after the RRAM chip has experienced the forming operation and initial reset operation. Thereafter, the fail bit value of each of the blocks is calculated and an operating characteristic curve of the RRAM chip is illustrated, and it is determined whether the operating condition for performing the forming operation and initial reset operation to the RRAM chip is appropriate according to whether the operating characteristic curve satisfies the first condition and the second condition.

To make the foregoing features and advantages of the present disclosure clearer and more comprehensible, embodiments are described below in detail with reference to the accompanying drawings.

DESCRIPTION OF THE EMBODIMENTS

Figure 1:
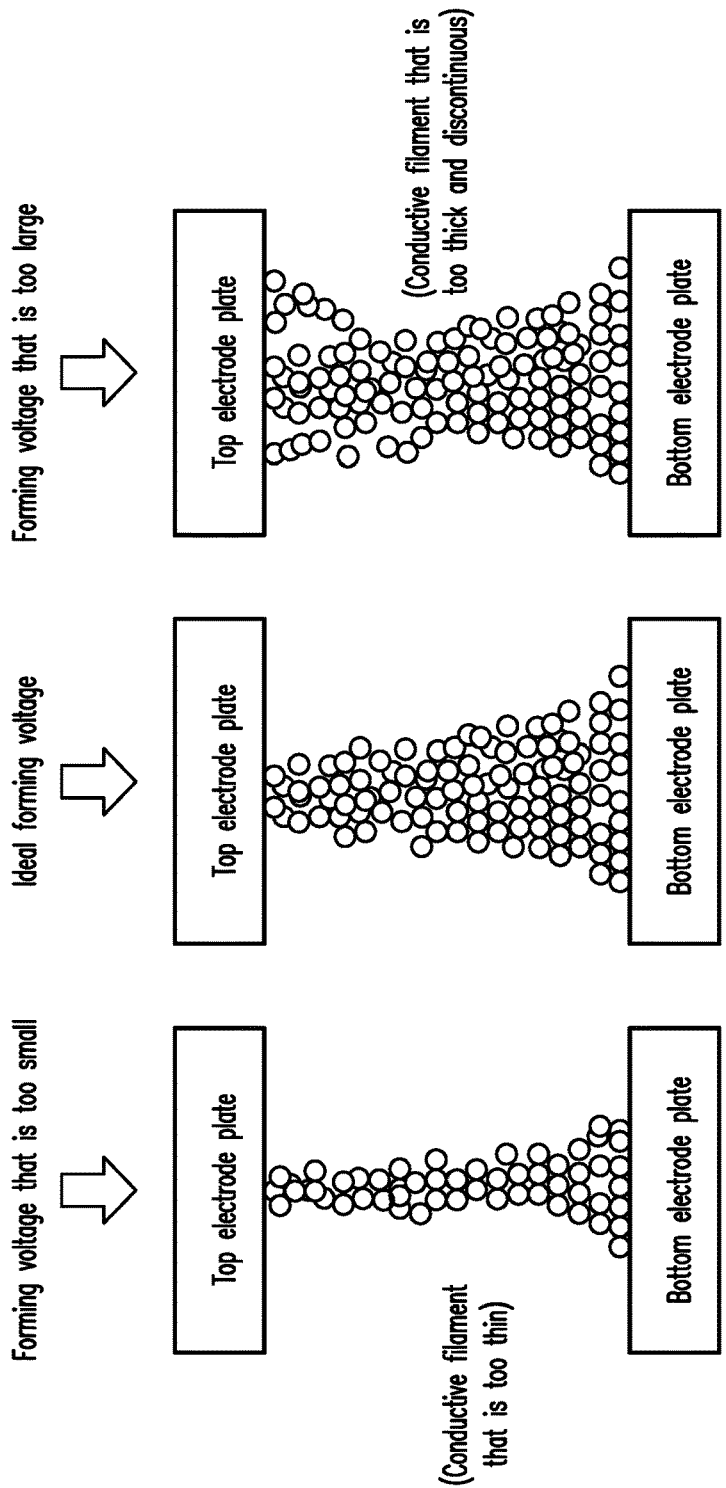
FIG. 1 shows aspects of conductive filaments that are formed under various forming voltage conditions according to an embodiment of the disclosure.

Referring to FIG. 1, if an RRAM memory cell is applied with a forming voltage that is too small in a forming operation, the obtained conductive filament will be too thin and thus can be easily broken. On the other hand, if the RRAM memory cell is applied with a forming voltage that is too large in the forming operation, the obtained conductive filament will be too thick, thus generating too many conducive paths and making it more difficult to control. Therefore, if an ideal forming operating condition (e.g., forming voltage) can be obtained, the formed conductive filament can have a better size, thereby providing a better conductive path.

Figure 2:
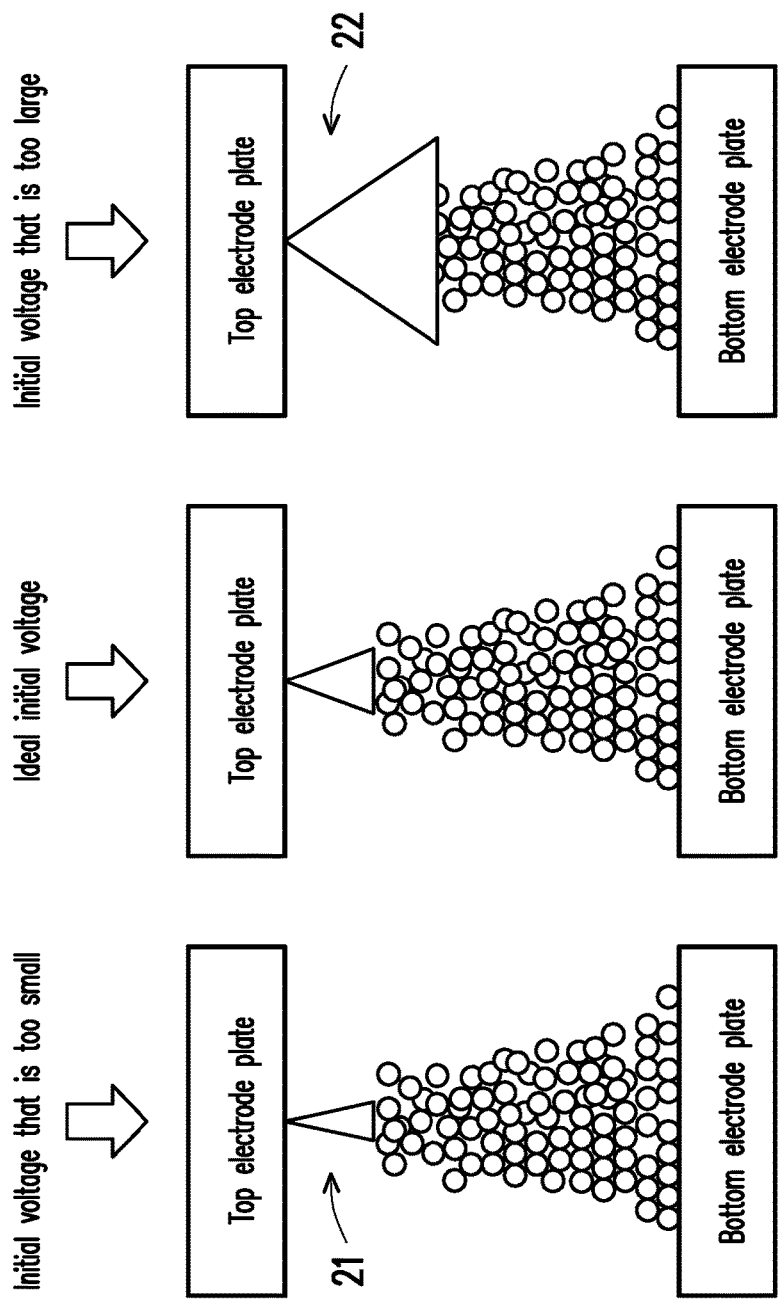
FIG. 2 shows aspects of conductive filaments that are formed under various initial reset voltage conditions according to an embodiment of the disclosure.

Referring to FIG. 2, generally speaking, the performance of the RRAM memory cell switching between resistance states (i.e., switching from HRS to LRS or switching from LRS to HRS) depends on the initial reset operation performed to the RRAM memory cell.

As shown in FIG. 2, if the RRAM memory cell is applied with an initial reset voltage that is too small in the initial reset operation, a short and narrow gap 21 will be formed between the conductive filament being reset and the top electrode plate. Under such circumstances, if the RRAM memory cell experiences the set operation and switched to LRS, the RRAM memory cell is likely to be turned into an over-set state.

On the contrary, if the RRAM memory cell is applied with an initial reset voltage that is too large in the initial reset operation, a long and wide gap 22 will be formed between the conductive filament being reset and the top electrode plate. Under such circumstances, it might be difficult to smoothly switch the RRAM memory cell to LRS even if the RRAM memory cell has experienced the set operation, that is, an under-set state might occur. Therefore, if an ideal initial reset operating condition (e.g., initial reset voltage) can be obtained, it is possible for the gap formed between the obtained conductive filament and the top electrode plate to have a better aspect, thereby facilitating subsequent resistance state switching operation.

In view of the above, the disclosure provides a method for obtaining an optimal operating condition of RRAM, wherein the method is capable of obtaining an optimal forming voltage and an optimal initial reset voltage that are the most suitable to be applied to the RRAM chip, thereby forming the conductive filament with an ideal aspect in each of the memory cells of the RRAM chip.

Figure 3:
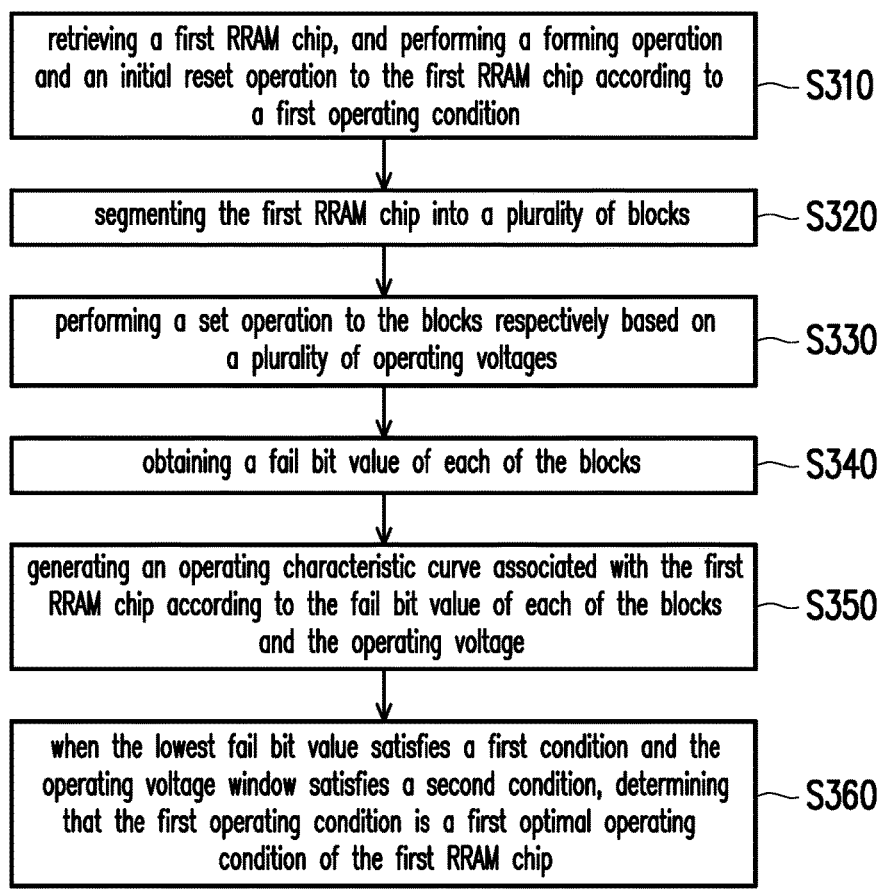
FIG. 3 illustrates a flow chart of a method for obtaining an optimal operating condition of RRAM according to an embodiment of the disclosure.
Figure 4:
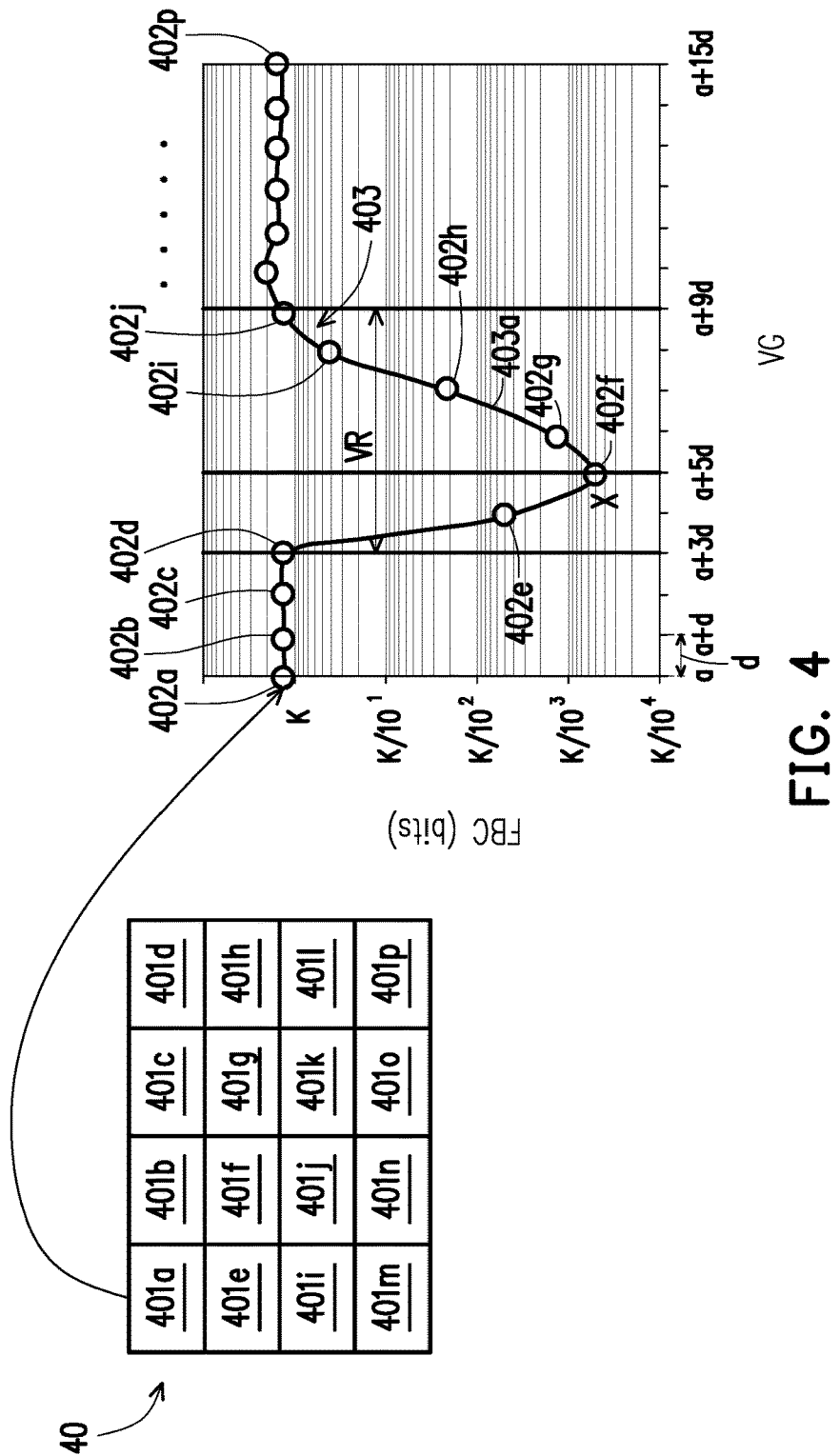
FIG. 4 is a schematic view of obtaining an operating characteristic curve of an RRAM chip according to an embodiment of the disclosure.

Referring to FIG. 3 and FIG. 4, first of all, in step S310, a first RRAM chip 40 may be retrieved, and a forming operation and an initial reset operation may be performed to the first RRAM chip 40 according to a first operating condition. In the embodiment, the first RRAM chip 40 may include a plurality of RRAM memory cells, and the first operating condition, for example, includes a first forming voltage and a first initial reset voltage. After the forming operation and the initial reset operation are performed to the first RRAM chip 40, each of the RRAM memory cells on the first RRAM chip 40 correspondingly forms a conductive filament with one of the aspects shown in FIG. 2.

Thereafter, in step S320, the first RRAM chip 40 may be segmented into a plurality of blocks 401a, 401b, . . . and 401p. In the embodiment, the first RRAM chip 40, for example, may be segmented into sixteen blocks 401a, 401b, . . . , and 401p having the same size, but in other embodiments, the first RRAM chip 40 may be segmented into N×M (N, M are positive integers) blocks having the same size depending on the designer's requirement as long as each of the blocks reflects the chip characteristic of the first RRAM chip 40, but the disclosure is not limited thereto. The blocks 401a, 401b, . . . , and 401p may respectively includes A memory cell pages, and each of the memory cell pages may include B RRAM memory cells, that is, each of the blocks 401a, 401b, . . . , and 401p may include A×B RRAM memory cells (A, B are integers).

Thereafter, in step S330, a set operation may be performed to the blocks 401a, 401b, and 401p respectively based on various operating voltages. In the embodiment, each of the operating voltage refers to gate voltages VG corresponding to each of the blocks 401a, 401b, . . . , and 401p, that is, the voltage applied to the word line of the RRAM memory cell in each of the blocks 401a, 401b, . . . , and 401p, but the disclosure is not limited thereto.

As shown in FIG. 4, the gate voltage VG in the embodiment may be applied to the block 401a at an initial value a to perform the set operation to the block 401a, such that the RRAM memory cell in the block 401a may perform one-time resistance state switch (i.e., from HRS to LRS). Thereafter, the gate voltage VG is incremented to a+d based on a step value d and subsequently applied to the block 401b to perform the set operation to the block 401b, such that the RRAM memory cell in the block 401b may perform one-time resistance state switch. Thereafter, the gate voltage VG may be incremented again to a+2d based on the step value d and subsequently applied to the block 401c to perform the set operation to the block 401c, such that the RRAM memory cell in the block 401c may perform one-time resistance state switch. In different embodiments, the values of a and d may be implemented by using arbitrary real numbers depending on the designer's requirement.

Similarly, the blocks 401d to 401p may be applied with corresponding gate voltage VG according to the above teaching such that the RRAM memory cell in the blocks 401d to 401p may perform one-time resistance state switch.

In step S340, a fail bit value (which may be represented by fail bit count (FBC)) of each of the blocks 401a to 401p may be obtained. In the embodiment, each of the RRAM memory cells in each of the blocks 401a to 401p is switched into LRS and generates memory cell current after experiencing the set operation. When the memory cell current of one RRAM memory cell in one of the blocks is measured to be smaller than one current threshold value, a fail bit value of corresponding block may be incremented.

For example, assuming that after the block 401a has experienced the set operation, the memory cell current of Z1 RRAM memory cells (Z1 is an integer) is measured to be smaller than the above-mentioned current threshold value, then the fail bit value of the block 401a may be determined as Z1. Likewise, after the block 401b has experienced the set operation, if there are Z2 RRAM memory cells (Z2 is an integer) having the memory cell current that is smaller than the above-mentioned current threshold value, the fail bit value of the block 401b may be determined as Z2. The fail bit value of the other blocks 401c to 401p may be obtained based on the above teachings and thus related descriptions are omitted hereinafter.

After the fail bit values of the blocks 401a to 401p are obtained, in step S350, an operating characteristic curve 403 associated with the first RRAM chip 40 may be generated according to the fail bit values of each of the blocks 401a to 401p and the above-mentioned operating voltage.

Specifically, as shown in FIG. 4, the operating characteristic curve 403 of the first RRAM chip 40 is a curve of the gate voltage VG with respect to the fail bit value (represented by FBC), wherein each of the data points (shown as circles) corresponds to one of the blocks 401a to 401p and may be used to label the fail bit value of the corresponding block after the block is applied with various gate voltages VG to perform the set operation. For example, a data point 402a may be used to label the FBC of the block 401a (which is, for example, applied with gate voltage VG at value a), and the FBC measured on the block 401a may be, for example, slightly larger than value K (K is a positive integer). Similarly, a data point 402b may be used to label the FBC of the block 401b (which is, for example, applied with gate voltage VG at value a+d), and a data point 402c may be used to label the FBC of the block 401c (which is, for example, applied with gate voltage VG at value a+2d).

After the FBC measured in the remaining blocks 401d to 401p are labeled with data points 402d to 402p according to the above teaching, the data points 402a to 402p may be connected to form the operating characteristic curve 403 of the first RRAM chip 40.

As shown in FIG. 4, the operating characteristic curve 403 of the first RRAM chip 40 has a lowest fail bit value X and an operating voltage window VR. In different embodiments, the lowest fail bit value X is, for example, the minimum fail bit value measured in each of the blocks. Taking FIG. 4 as an example, the lowest fail bit value X (ranging from $K/10^3$ to $K/10^4$) corresponds to a block 401f, that is, among the blocks 401a to 401p, the fail bit value measured in the block 401f is the lowest.

Additionally, FIG. 4 shows that the operating characteristic curve 403 of the first RRAM chip 40 has a U-shaped segment 403a, which has a first end point (corresponding to the data point 402d) and a second end point (corresponding to the data point 402j); the first end point corresponds to a first operating voltage (e.g., a+3d), and the second end point corresponds to a second operating voltage (e.g., a+9d). Under such circumstances, the window between the first operating voltage and the second operating voltage may be defined as operating voltage window VR of the operating characteristic curve 403, and the width of the operating voltage window VR is, for example, 6d (i.e., (a+9d)−(a+3d)), the disclosure provides no limitation thereto.

In the embodiment, the difference between the fail bit values of adjacent data points on the operating characteristic curve 403 may be calculated. When the difference between the fail bit value of a first data point and the fail bit value of the next data point on the operating characteristic curve 403 is obviously larger, the first data point may be regarded as the first end point (e.g., data point 402d) of the operating characteristic curve 403. On the other hand, when a difference between the fail bit value of a second data point and the fail bit value of the next data point on the operating characteristic curve 403 is obviously smaller, the second data point may be regarded as the second end point (e.g., data point 402j) of the operating characteristic curve 403.

Specifically, in the operating characteristic curve 403 shown in FIG. 4, the region on the left side of the data point 402d may be referred to as a under-set region, and the region on the right side of the data point 402j may be referred to as an over-set region. For designer of the first RRAM chip 40, a preferable operating characteristic curve should at least have the following two characteristics: (1) the gate voltage VG corresponding to the lowest fail bit value X is smaller; and (2) the width of the operating voltage window VR is appropriate.

Regarding the characteristic (1), it represents that the under-set region is narrower (i.e., the gate voltage VG corresponding to the lowest fail bit value X is smaller), such that the first RRAM chip 40 can be easily set to be LRS later after experiencing the forming operation and the initial reset operation. Regarding the characteristic (2), if the width of the operating voltage window VR is too small, it represents that the conductive filament obtained in each of the RRAM memory cells of the first RRAM chip 40 after experiencing the forming operation and the initial reset operation might be too thin, and the problem of complementary switching (CS) is likely to occur in subsequent resistance switching operations, that is, the memory cell current measured after switching to LRS is decreased instead of being increased (i.e., the resistance is increased instead of being decreased). On the other hand, if the width of the operating voltage window VR is too large, it represents that the conductive filament obtained in each of the RRAM memory cells of the first RRAM chip 40 after experiencing the forming operation and the initial reset operation might be too thick, and the problem mentioned in descriptions concerning FIG. 2 might occur.

In other words, through the operating characteristic curve 403 illustrated based on the one-time set operation performed to each one of the blocks 401a to 401p of the first RRAM chip 40, it can be observed that whether a conductive filament having a preferable aspect can be formed in each of the RRAM memory cells through the forming operation and the initial reset operation that the RRAM chip 40 previously experiences. That is, the operating characteristic curve 403 can be utilized to examine whether the first operating condition is ideal enough, i.e., whether the operating characteristic curve 403 has the characteristics (1) and (2) mentioned above.

In the embodiment of the disclosure, step S360 described below can be utilized to determine whether the first operating condition is ideal enough.

Specifically, in step S360, when the lowest fail bit value X satisfies the first condition and the operating voltage window VR satisfies the second condition, it can be determined that the first operating condition is a first optimal operating condition of the first RRAM chip 40.

Specifically, in an embodiment, when the lowest fail bit value X is smaller than a predetermined ratio of the total number of RRAM memory cells in the first RRAM chip 40, it can be determined that the lowest fail bit value X satisfies the first condition, and the first condition may be regarded as corresponding to the characteristic (1) mentioned above. That is, when the lowest fail bit value X satisfies the first condition, it can be determined that the operating characteristic curve 403 has the characteristic (1).

In an embodiment, the above-mentioned predetermined ratio is 20%, that is, when the lowest fail bit value X is smaller than 20% of the total number of the RRAM memory cells in the first RRAM chip 40, it can be determined that the lowest fail bit value X satisfies the first condition. In another embodiment, the above-mentioned predetermined ratio is 10%. In a preferable embodiment, the above-mentioned predetermined ratio is 5%.

In another embodiment, when the width of the operating voltage window VR is larger than a predetermined voltage value, it can be determined that the operating voltage window VR satisfies the second condition, and the second condition may be regarded as corresponding to the above-mentioned characteristic (2). In other words, when the operating voltage window VR satisfies the second condition, it can be determined that the operating characteristic curve 403 has the characteristic (2).

In an embodiment, the predetermined voltage value is 0.3V, that is, when the width of the operating voltage window VR is larger than 0.3V, it can be determined that the operating voltage window VR satisfies the second condition. In a preferable embodiment, the above-mentioned predetermined voltage value is 0.6V.

In detail, when the lowest fail bit value X and the operating voltage window VR of the operating characteristic curve 403 respectively satisfy the first condition and the second condition, it represents that the first operating condition adopted in step S310 makes it possible to obtain a conductive filament having a preferable aspect (the aspect shown in the middle of FIG. 2) after each of the RRAM memory cells of the first RRAM chip 40 has experienced the forming operation and the initial reset operation. Therefore, the first operating condition may be defined as the optimal operating condition of the first RRAM chip 40.

Under such circumstances, when the designer is desired to perform the forming operation and the initial reset operation to other RRAM chips manufactured through the same process as the first RRAM chip 40, the first operating condition may be adopted directly to apply the first forming voltage and the first initial reset voltage to the RRAM chips, thereby forming the conductive filament having a preferable aspect (e.g., the aspect shown in the middle of FIG. 2) in each of the RRAM memory cells of the RRAM chips.

As can be known from the above, the method provided in the embodiment of the disclosure can quickly and effectively obtain the suitable operating condition for performing forming operation and initial reset operation to the RRAM chip, such that each of the RRAM memory cells of the RRAM chip can correspondingly form the conductive filament having a preferable aspect after experiencing the forming operation and the initial reset operation, thereby facilitating the subsequent resistance state switching operations.

Additionally, in other embodiments, when the lowest fail bit value X of the operating characteristic curve 403 does not satisfy the first condition or the operating voltage window VR does not satisfy the second condition, the method shown in FIG. 3 may be performed subsequently to a second RRAM chip manufactured through the same process as the first RRAM chip based a second operating condition.

Specifically, the forming operation and the initial reset operation may be performed to the second RRAM chip according to the second operating condition, and the second operating condition, for example, includes a second forming voltage and a second initial reset voltage. Thereafter, the second RRAM chip may be segmented into a plurality of blocks, and the set operation may be performed to the blocks of the second RRAM chip respectively based on the above-mentioned operating voltage. Thereafter, the fail bit value of each of the blocks in the second RRAM chip is obtained, and the operating characteristic curve associated with the second RRAM chip is illustrated according to the teaching provided in the previous embodiment. Similar to the operating characteristic curve 403, the operating characteristic curve of the second RRAM chip also has the lowest fail bit value and the operating voltage window.

When the lowest fail bit value and the operating voltage window corresponding to the second RRAM chip respectively satisfy the first condition and the second condition, it can be determined that the second operating condition is a second optimal operating condition of the second RRAM chip.

In other words, if the first operating condition does not make each of the RRAM memory cells of the first RRAM chip 40 to form the conductive filament having a preferable aspect, the method of the disclosure can perform the forming operation and the initial reset operation to the second RRAM chip based on the second operating condition different from the first operating condition, and illustrate the operating characteristic curve of the second RRAM chip subsequently based on the above teachings. If the operating characteristic curve of the second RRAM chip has the above characteristics (1) and (2), it represents that the adopted second operating condition makes it possible for each of the RRAM memory cells of the second RRAM chip to form the conductive filament having a preferable aspect (e.g., aspect shown in the middle of FIG. 2) after experiencing the forming operation and the initial reset operation. Therefore, the second operating condition is defined as the optimal operating condition of the second RRAM chip.

Under such circumstances, when the designer is desired to perform the forming operation and the initial reset operation to other RRAM chips manufactured through the same process as the second RRAM chip, the second operating condition may be adopted directly to apply the second forming voltage and the second initial reset voltage to the RRAM chips, thereby forming the conductive filament having a preferable aspect (e.g., aspect shown in the middle of FIG. 2) in each of the RRAM memory cells of the RRAM chips.

On the contrary, if the operating characteristic curve of the second RRAM chip does not have the characteristic (1) and/or the characteristic (2), the embodiment of the disclosure can subsequently adopt other operating conditions to perform the operation described in the above teachings to other RRAM chips manufactured through the same process until the operating condition making the illustrated operating characteristic curve have the characteristics (1) and (2) is obtained.

Figure 5:
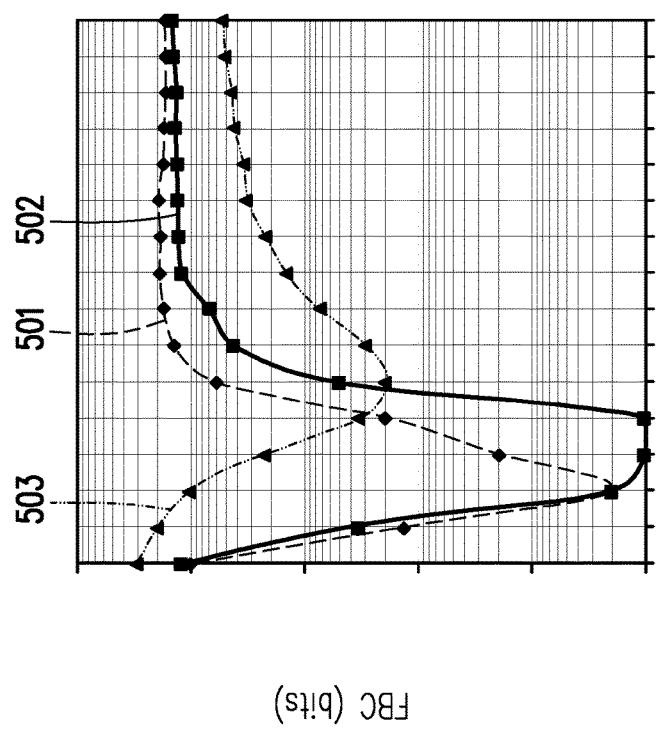
FIG. 5 is a schematic view of a plurality of operating characteristic curves that are illustrated according to an embodiment of the disclosure.

Referring to FIG. 5, in the embodiment, assuming that the operating characteristic curves 501, 502 and 503 are illustrated based on the teaching provided in the previous embodiment after various RRAM chips have experienced various forming voltages and initial reset voltages.

In FIG. 5, although the operating characteristic curve 501 has a narrower under-set region (i.e., steeper slope), since the over-set region is wider, it represents that the corresponding initial reset voltage might be too small. In other words, after the RRAM chip corresponding to the operating characteristic curve 501 has experienced the forming operation and the initial reset operation, the obtained conductive filament structure is overly loose, thus can be easily broken after experiencing the set operation, and can easily generate a diffusion path, which causes the resistance to be increased instead of being decreased. That is to say, since the selected initial reset voltage is too low, the RRAM chip corresponding to the operating characteristic curve 501 has poor high temperature data retention (HTDR) and durability.

On the other hand, since the operating characteristic curve 503 has a wider under-set region, it represents that the corresponding initial reset voltage might be too large. In other words, after the RRAM chip corresponding to the operating characteristic curve 503 has experienced the forming operation and the initial reset operation, the gap between the obtained conductive filament structure and the top electrode plate is too big, which causes that the resistance cannot be actually switched to LRS since the conductive filament cannot be appropriately connected to the upper electrode plate after the set operation is performed. In other words, since the selected initial reset voltage is too large, the RRAM chip corresponding to the operating characteristic curve 503 also has poor HTDR.

In comparison, the forming operation and the initial reset operation performed to the RRAM chip corresponding to the operating characteristic curve 502 are obviously better than the other two, and thus the corresponding forming voltage and the initial reset voltage may be regarded as the optimal operating condition, and the forming operation and the initial reset operation may be performed to other RRAM chips manufactured through the same process.

In other embodiments, the method provided in the embodiment of the disclosure may further illustrate operating characteristic curves at one time respectively for a plurality of RRAM chips (or a plurality of small RRAM chips divided from one big RRAM chip) manufactured through the same process, and an operating characteristic curve having the characteristics (1) and (2) is selected therefrom. Also, if a plurality of operating characteristic curves having the characteristics (1) and (2) are obtained simultaneously, the method provided in the disclosure may further compare the operating characteristic curves to find the preferable operating characteristic curve and correspondingly obtain the optimal operating condition.

Figure 6:
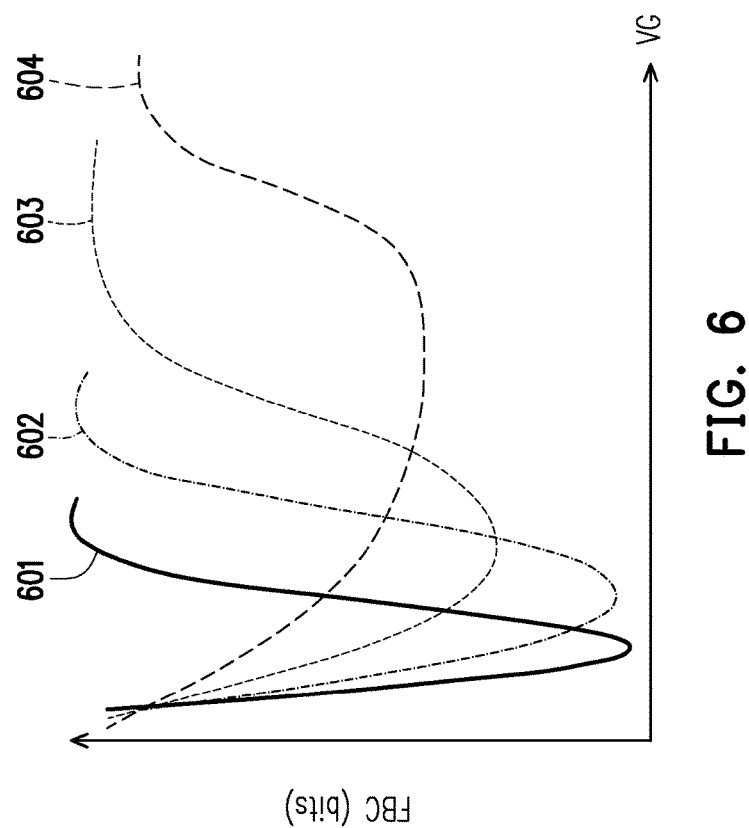
FIG. 6 is a schematic view of a plurality of operating characteristic curves that are illustrated according to another embodiment of the disclosure.

Referring to FIG. 6, in the embodiment, assuming that operating characteristic curves 601, 602, 603 and 604 are illustrated based on the teachings provided in the previous embodiment after various RRAM chips have experienced various forming voltages and initial reset voltages.

In FIG. 6, assuming that only the lowest fail bit value and the operating voltage window of the operating characteristic curve 602 respectively satisfy the first condition and the second condition, it can be determined that the forming voltage and the initial reset voltage corresponding to the operating characteristic curve 602 are the optimal operating conditions of each of the RRAM chips.

However, if the lowest fail bit value and the operating voltage window of the operating characteristic curve 601 respectively satisfy the first condition and the second condition as well, the lowest fail bit value of the operating characteristic curve 601 and the lowest fail bit value of the operating characteristic curve 602 may be compared subsequently.

For example, it can be determined that whether the lowest fail bit value of the operating characteristic curve 601 is lower than the lowest fail bit value of the operating characteristic curve 602. As can be known from FIG. 6, the lowest fail bit value of the operating characteristic curve 601 is lower than the lowest fail bit value of the operating characteristic curve 602, and therefore it can be determined that the forming voltage and the initial reset voltage corresponding to the operating characteristic curve 601 are the optimal operating conditions of each of the RRAM chips.

In other embodiments, if the lowest fail bit value of the operating characteristic curve 601 is higher than the lowest fail bit value of the operating characteristic curve 602, it can be determined that the forming voltage and the initial reset voltage corresponding to the operating characteristic curve 602 are the optimal operating conditions of each of the RRAM chips.

In other embodiments, if the lowest fail bit value of the operating characteristic curve 601 is equal to the lowest fail bit value of the operating characteristic curve 602, it can be subsequently determined whether the operating voltage window of the operating characteristic curve 601 is larger than the operating voltage window of the operating characteristic curve 602. If yes, it is determined that the forming voltage and the initial reset voltage corresponding to the operating characteristic curve 601 are the optimal operating conditions; otherwise, it is determined that the forming voltage and the initial reset voltage corresponding to the operating characteristic curve 602 are the optimal operating conditions of each of the RRAM chips.

In summary, the method provided in the embodiment of the disclosure is capable of performing various set operations to various blocks of RRAM chip based on various operating voltages after forming operation and initial reset operation are performed to the RRAM chip. Thereafter, the fail bit value of each of the blocks is calculated and an operating characteristic curve of the RRAM chip is illustrated, and it can be determined that whether the operating conditions for performing the forming operation and the initial reset operation to the RRAM chip are appropriate according to the operating characteristic curve. If the lowest fail bit value and the operating voltage window of the operating characteristic curve respectively satisfy the first condition and the second condition, it is determined that the operating conditions corresponding to the above-mentioned forming operation and the initial reset operation are the optimal operating conditions of the RRAM chip.

Additionally, the embodiment of the disclosure may illustrate a plurality of operating characteristic curves corresponding to a plurality of RRAM chips that have experienced various forming operations and initial reset operations at one time, and find the optimal operating characteristic curve therefrom, thereby using the operating conditions corresponding to the forming operation and the initial reset operation as the optimal operating condition of the RRAM chip.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for obtaining an optimal operating condition of a resistive random access memory, comprising:
    retrieving a first resistive random access memory chip, and performing a first forming operation and a first initial reset operation to the first resistive random access memory chip according to a first operating condition;
    segmenting the first resistive random access memory chip into a plurality of first blocks;
    performing a set operation to the first blocks respectively based on a plurality of operating voltages;
    obtaining a first fail bit value of each of the first blocks;
    generating a first operating characteristic curve associated with the first resistive random access memory chip according to the first fail bit value of each of the first blocks and the operating voltages, wherein the first operating characteristic curve has a first lowest fail bit value and a first operating voltage window; and
    when the first lowest fail bit value satisfies a first condition and the first operating voltage window satisfies a second condition, determining that the first operating condition is a first optimal operating condition of the first resistive random access memory chip.

2. The method as claimed in claim 1, wherein each of the first blocks comprises a plurality of memory cells, each of the memory cells is switched to a low resistance state and generates a memory cell current after experiencing the set operation, wherein the step of obtaining the first fail bit value of each of the first blocks comprises:
    measuring the memory cell current of each of the memory cells, and determining whether the memory cell current is lower than a current threshold value; and
    when the memory cell current is lower than the current threshold value, accumulating the first fail bit value of the corresponding first block.

3. The method as claimed in claim 1, wherein the operating voltages are a plurality of gate voltages corresponding to the first resistive random access memory chip.

4. The method as claimed in claim 1, wherein the first resistive random access memory chip comprises a plurality of memory cells, and when the first lowest fail bit value is smaller than a predetermined ratio of a total number of the memory cells, determining that the first lowest fail bit value satisfies the first condition.

5. The method as claimed in claim 4, wherein the predetermined ratio is 20%.

6. The method as claimed in claim 4, wherein the predetermined ratio is 10%.

7. The method as claimed in claim 4, wherein the predetermined ratio is 5%.

8. The method as claimed in claim 1, wherein the first operating characteristic curve comprises a U-shaped segment, the U-shaped segment has a first end point and a second end point, the first end point corresponds to a first operating voltage, the second end point corresponds to a second operating voltage, and a window between the first operating voltage and the second operating voltage is the first operating voltage window.

9. The method as claimed in claim 1, wherein when a width of the first operating voltage window is larger than a predetermined voltage value, determining that the first operating voltage window satisfies the second condition.

10. The method as claimed in claim 9, wherein the predetermined voltage value is 0.3V.

11. The method as claimed in claim 9, wherein the predetermined voltage value is 0.6V.

12. The method as claimed in claim 1, further comprising:
retrieving a second resistive random access memory chip, and performing a second forming operation and a second initial reset operation to the second resistive random access memory chip according to a second operating condition, wherein the second resistive random access memory chip and the first resistive random access memory chip are manufactured through the same process;
segmenting the second resistive random access memory chip into a plurality of second blocks;
performing the set operation to the second blocks respectively based on the operating voltages;
obtaining a second fail bit value of each of the second blocks;
generating a second operating characteristic curve associated with the second resistive random access memory chip according to the second fail bit value of each of the second blocks and the operating voltages, wherein the second operating characteristic curve has a second lowest fail bit value and a second operating voltage window; and
when the second lowest fail bit value satisfies the first condition and the second operating voltage window satisfies the second condition, determining that the second operating condition is a second optimal operating condition of the second resistive random access memory chip.

13. The method as claimed in claim 12, further comprising:
determining whether the first lowest fail bit value is smaller than the second lowest fail bit value;
if yes, determining that the first operating condition is an optimal operating condition of the first resistive random access memory chip and the second resistive random access memory chip.

14. The method as claimed in claim 12, wherein when the first lowest fail bit value is equal to the second lowest fail bit value, further comprising:
determining whether the first operating voltage window is larger than the second operating voltage window;
if yes, determining that the first operating condition is an optimal operating condition of the first resistive random access memory chip and the second resistive random access memory chip.

15. The method as claimed in claim 1, wherein when the first lowest fail bit value does not satisfy the first condition or the first operating voltage window does not satisfy the second condition, further comprising:
retrieving a second resistive random access memory chip, and performing a second forming operation and a second initial reset operation to the second resistive random access memory chip according to a second operating condition, wherein the second resistive random access memory chip and the first resistive random access memory chip are manufactured through the same process;
segmenting the second resistive random access memory chip into a plurality of second blocks;
performing the set operation to the second blocks respectively based on the operating voltages;
obtaining a second fail bit value of each of the second blocks;
generating a second operating characteristic curve associated with the second resistive random access memory chip according to the second fail bit value of each of the second blocks and the operating voltages, wherein the second operating characteristic curve has a second lowest fail bit value and a second operating voltage window; and
when the second lowest fail bit value satisfies the first condition and the second operating voltage window satisfies the second condition, determining that the second operating condition is a second optimal operating condition of the second resistive random access memory chip.

* * * * *